United States Patent [19]

Terao et al.

[11] Patent Number: 5,101,411
[45] Date of Patent: Mar. 31, 1992

[54] ORGANIC NON-LINEAR OPTICAL DEVICE

[75] Inventors: Hiromu Terao; Kayo Ohno; Yuzo Ito, all of Hitachi; Masato Isogai, Mito; Tomoyuki Hamada; Yasuo Imanishi, both of Hitachi; Atushi Kakuta, Hitachiohta, all of Japan

[73] Assignee: Hitachi, Ltd., Tokyo, Japan

[21] Appl. No.: 589,262

[22] Filed: Sep. 28, 1990

[30] Foreign Application Priority Data

Sep. 29, 1989 [JP] Japan .................... 1-251921

[51] Int. Cl.$^5$ .................................................. H01S 3/10
[52] U.S. Cl. ........................................ 372/21; 359/326; 359/885; 252/582; 252/583
[58] Field of Search ...................... 372/21; 350/311; 307/425-429; 252/582, 583, 600

[56] References Cited

U.S. PATENT DOCUMENTS

| | | | |
|---|---|---|---|
| 4,707,303 | 11/1987 | Buckley et al. | 372/21 |
| 4,717,508 | 1/1988 | DeMartino | 372/21 |
| 4,720,355 | 1/1988 | DeMartino | 372/21 |
| 4,766,171 | 8/1988 | DeMartino | 372/21 |

Primary Examiner—Leon Scott, Jr.
Attorney, Agent, or Firm—Antonelli, Terry, Stout & Kraus

[57] ABSTRACT

In a semiconductor laser wavelength conversion device comprising a semiconductor laser beam souce, a lens, a single crystal of a non-linear optical material and a filter, the non-linear optical material is represented by the general formula, A—(Cx)—B, where (Cx) is —(C-H)—or —CH=CH—C(=CH)—, A and B are each atomic group comprising a $\pi$-electron conjugated structure containing at least one electron withdrawing group or one electron donating group. The device can generate a second harmonic wave having an intensity of 4 or more stronger than that of urea and having a cutoff wavelength of 420 nm or less.

15 Claims, 1 Drawing Sheet

ORGANIC NON-LINEAR OPTICAL DEVICE

FIELD OF THE INVENTION

The present invention relates to an optical device using non-linear optical effect of an organic material, and more specificcally, to optical devices such as frequency modulation devices by second harmonic generation and parametric oscilation, and optical switches by Pockel's effect.

PRIOR ART

Recently, applications of optical devices utilizing non-linear optical materials in the optoelectronic field are becoming important since they have variety of functions such as second and third harmonic generation, optical mixing, optical parametric oscilation, optical modulation, optical switching, etc. which are all utilizing second order or third order non-linear polarization due to electromagnetic field. Further, the application of the device as an optical computers is attracting attention.

As non-linear optical materials, there have been proposed inorganic crystalline materials such as lithium niobate ($LiNbO_3$), potassium dihydrogen phosphate ($KH_2PO_4$, KDP), ammonium dihydrogen phosphate ($NH_4H_2PO_4$, ADP), etc. These inorganic materials are, however, extremely expensive if they are highly pure enough to be used in optical devices, not easy to handle because of its deliquesce, and have poor prospects for increasing their non-linear optical constants, and have difficulty in high speed response below pico second order because of their ionic properties.

On the one hand, organic non-linear optical materials having a large non-linear optical constant and a high optical response speed (an optical response speed of femto second order is conceived possible) are under development. For instance, urea, 2-methyl-4-nitroaniline (MNA) is disclosed in JP-A-55-50096 (1980), N-(4-nitrophenyl)-L-prolinole (NPP) in JP-A-59-21665 (1984), benzimidazole derivatives in R. V. Vizgert, et al., Sov. J. Quantum Electron., 12, 214 (1982) and JP-A-62-210430 (1987) and chalcone derivatives in JP-A-63-85526 (1988) and JP-A-1-26827 (1989).

JP-A-62-210432 discloses that the following compound can be used as a non-linear optical material.

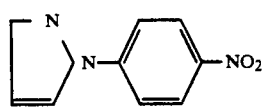

(A)

Among them, urea exhibits no absorption in visible light region, but has a very small non-linear optical constant. MNA and NPP have a relatively large non-linear optical constant, but have absorption in visible light region. As for benzimidazole derivatives, chalcone derivatives and compound (A), they have some troubles about stability of the compound and making single crystals. These conventional materials do not satisfy all non-linear optical properties required for optical devices.

SUMMARY OF THE INVENTION

An object of the present invention is to provide an optical device using a non-linear optical material which has a good non-linear optical characteristics (e.g. a large non-linear optical constant) in crystalline state and a short cuttoff wavelength.

For achieving the above object, the present inventors have made researches on organic non-linear optical materials to find possibility of application to optical devices. They also conducted molecular designs by calculating hyper polarizability of a molecule, the lowest exitation energy and molecular interaction.

According to the present invention, non-linear optical materials which have a large non-linear optical constant (intensity of second harmonic light) and a short cutoff wavelength of less than 420 nm are obtained, whereby optical devices such as frequency doubler of a laser diode and an optical swithing device are provided.

DETAILED EXPLANATION OF THE EMBODIMENTS

Figure 1:
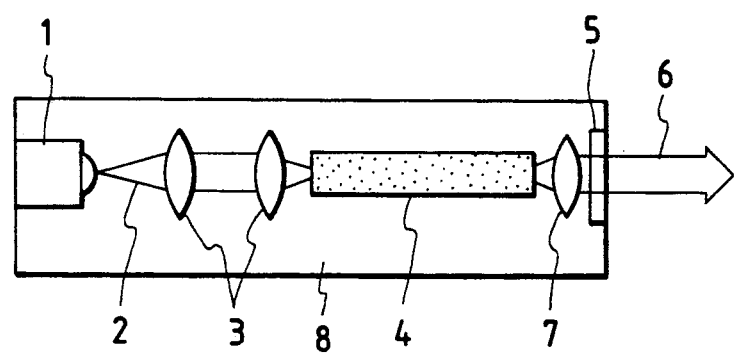
FIG. 1 is a schematic diagram of a frequency doubler of a laser diode, which uses the organic non-linear optical materials.

The present invention provides a frequency boubler of a laser diode comprising a semiconductor laser beam source, a lens for focussing the beam on a single crystal of a non-linear optical material, and a filter in which the non-linear optical material is a compound represented by the following general formula,

where (Cx) is $-(CH_2)_3-$ or $-CH=CH-C(=CH_2)-$, A and B are each an atomic group comprising a $\pi$ electron conjugation structure containing at least one electon withdrawing group or one electron donating group, A and B being the same or different.

The cutoff wavelengths of the single crystals of the compound used in the present invention are less than 420 nm, particularly 400 nm and the intensity of the second harmonic light against that of urea is 4 or more, particularly 5 or more.

In the present invention, particularly useful non-linear optical materils are represented by the general formula:

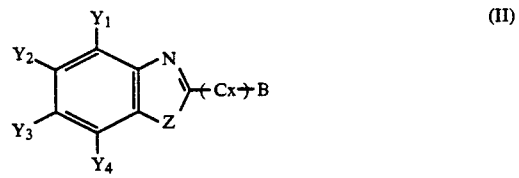

where (Cx) is $-(CH_2)_3-$ or $-CH=CH-C(=CH_2)-$, $Y_1 \sim Y_4$ are H, electron withdrawing groups or electron donating groups, B is an atomic group comprising a $\pi$-electron conjugated structure containing at least one electron withdrawing group or one electron donating group, and z is $-O-$, $-NH-$, $-S-$ or $-CO-$.

Particularly useful compounds among the above compounds are represented by the following general formula,

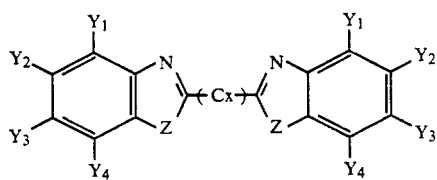
where (Cx), $Y_1 \sim Y_4$ and z are the same meanings as set forth above.
Specific examples of the compounds mentioned above are shown in the following together with cutoff wavelengths (nm) and relative intensities of second harmonic wave with respect to the intensity of urea.
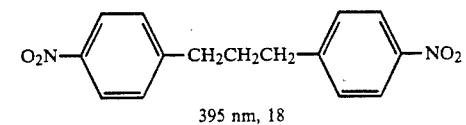
395 nm, 18 (1)
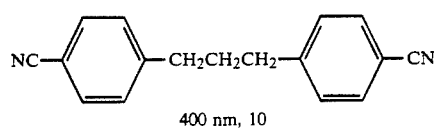
400 nm, 10 (2)
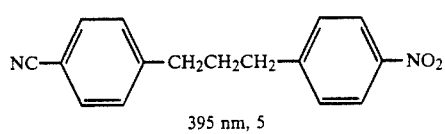
395 nm, 5 (3)
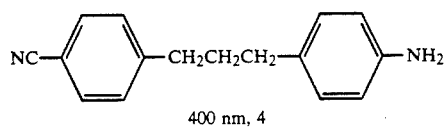
400 nm, 4 (4)
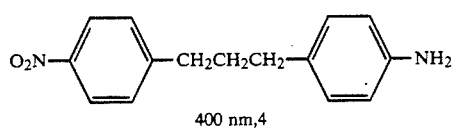
400 nm, 4 (5)
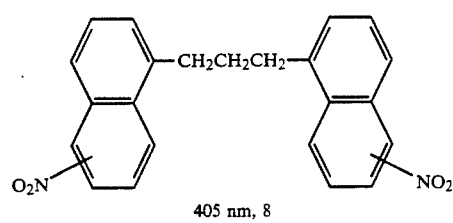
405 nm, 8 (6)
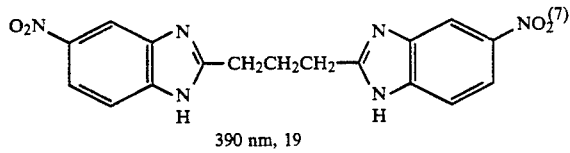
390 nm, 19 (7)
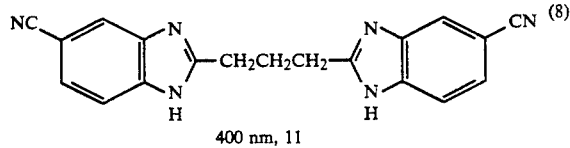
400 nm, 11 (8)
-continued
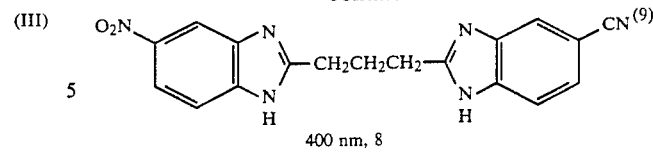
400 nm, 8 (9)
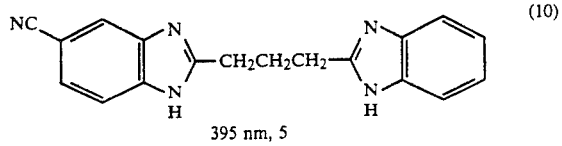
395 nm, 5 (10)
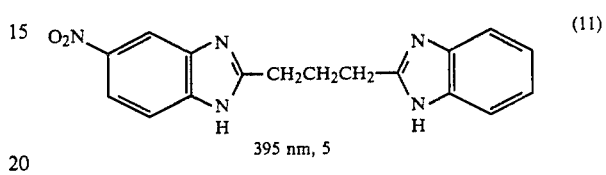
395 nm, 5 (11)
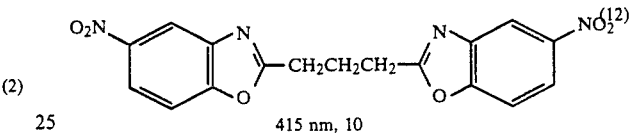
415 nm, 10 (12)
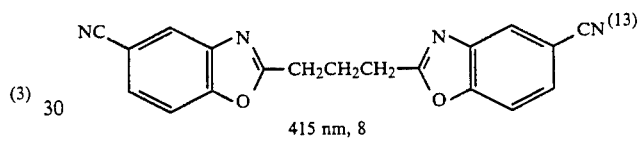
415 nm, 8 (13)
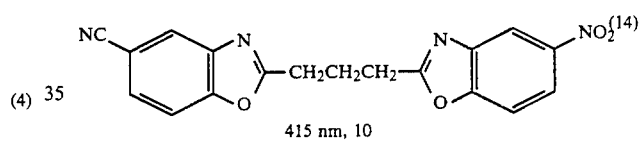
415 nm, 10 (14)
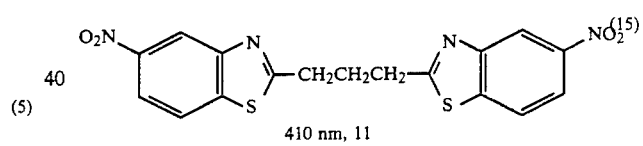
410 nm, 11 (15)
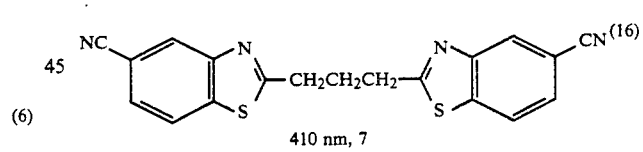
410 nm, 7 (16)
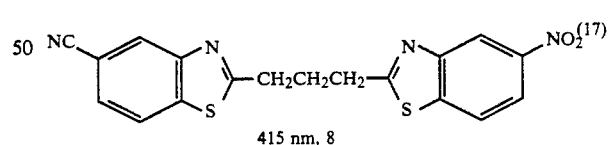
415 nm, 8 (17)
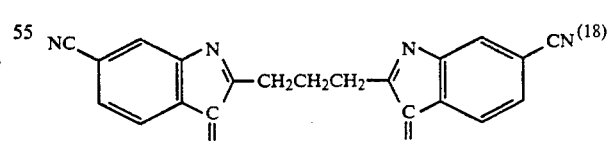
405 nm, 10 (18)
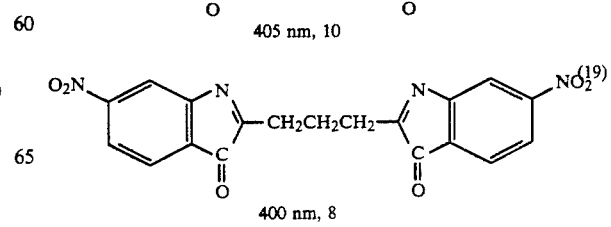
400 nm, 8 (19)

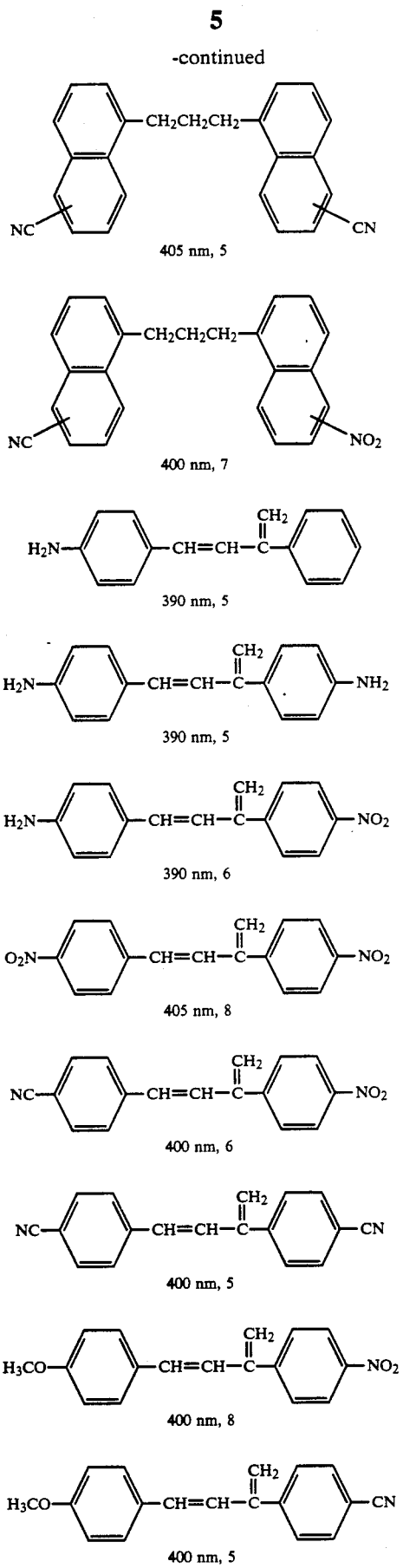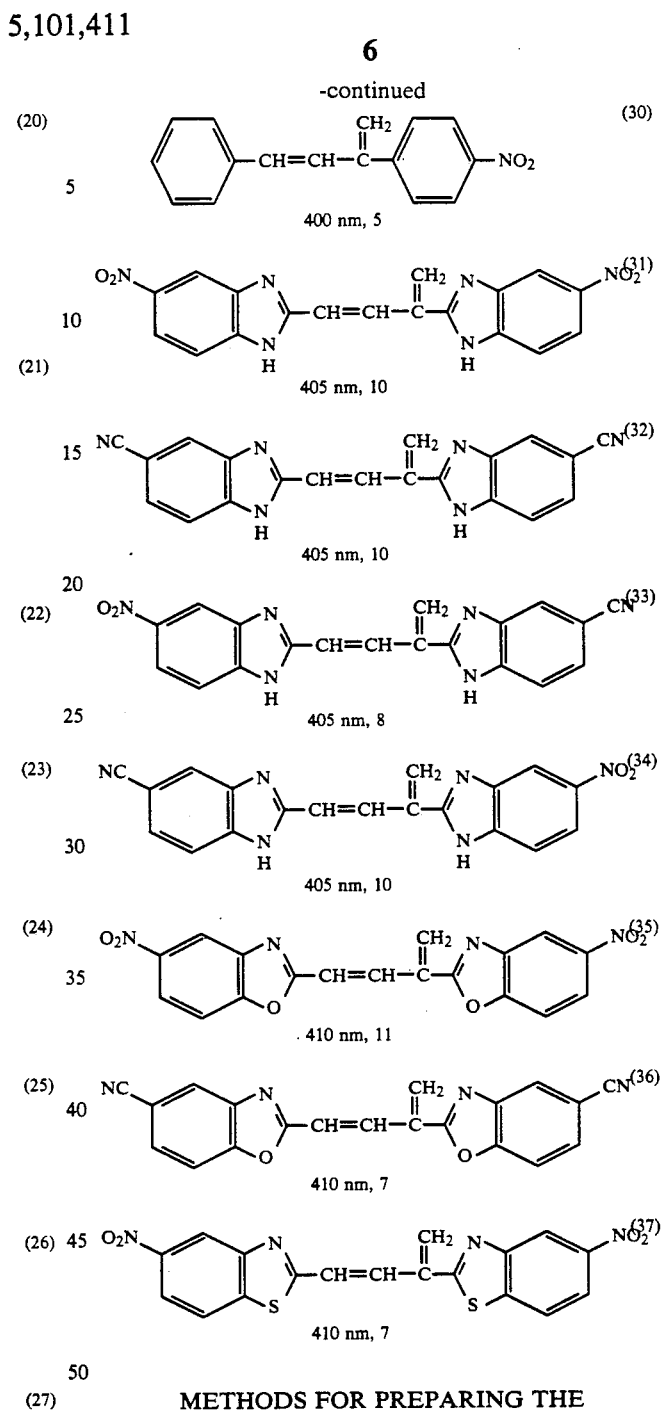

METHODS FOR PREPARING THE COMPOUNDS

The compounds are prepared by the following methods (A)~(J).

(A) 1 Mol of glutaric acid is reacted with 2 mol of 1,2-phenylene diamine to produce 1,3-bis-(1(3)H-bezimidazole-2-yl)-propane.

Thereafter the resultant compound is nitrated by adding potassium nitrate and sulfuric acid, thereby to obtain 1,3-bis-[5-nitro-1(3)H-bezimidazole-2-yl]-propane (compound (7)).

This process is applicable to imidazole derivatives such as (7)–(11) and (31)–(34).

(B) 1 Mol of glutaric acid is reacted with 2 mols of aminophenol to produce 1,3-bis-(bezoxazole-2-yl)-propane.

Thereafter the resultant compound is nitrated in the same manner as in process (A) to obtain 1,3-bis-[5-nitrobezimidazole-2-yl]-propane (compound (19)).

This process is applicable to oxazole derivatives such as (12)–(14), (18), (19) (35) and (36).

(C) 1 Mol of glutaric acid is reacted with 2 mols of 1-aminothiol to produce 1,3-bis-(bezothiazole-2-yl)-propane.

Thereafter the resultant compound is nitrated in the same manner as in process (A) to obtain 1,3-bis-[5-nitrobezothiazole-2-yl]-propane (compound (15)).

This process is applicable to thiazole derivatives such as (15)–(17) and (37).

(D) 1 Mol of p-anisaldehyde is reacted with 1 mol of p-nitroacetophenone are reacted in a solution such as hexane using sodium hydroxide. After aldol-condensation, carbonyl group of the resultant a compound was converted into olefin using Wittig regent to obtain compound No. 28.

This process is applicable to phenyl derivatives such as (1)–(5) and (22)–(30).

(E) 1 Mol of dibenzyl keton dissolved in triethylene glycol is reacted with 1 mol of hydrazine and potassium hydroxide to react them. To the resulting 1,3-diphenyl propane is added fuming nitric acid dissolved in acetic acid anhydride to produce dinitrophenyl propane.

This process is applicable to compounds having one or two nitro groups in the molecule such as (1), (6), (11), (15), (19), (25), (28), (30), (31) or (35).

(F) 1 Mol of cyanobenzaldehyde and 1 mol of 4-acetylbenzonitryl are reacted with sodium hydroxide in ethanol. The resulting 1,3-bis(p-cyanophenyl)-3-hydropropane is reacted with $KHSO_4$ to obtain p-sicyanochalcone. The p-dicyanochalcone is hydrogenated in the presence of a platinum catalyst to produce 1,3-bis(p-cyanophenyl)propane. The resulting compound is reacted with hydrazine and potassium hydroxide in triethylene glycol to produce p-dicyanophenyl propane.

This process is applicable to compounds having one or two cyano groups in the molecule such as (2), (8), (10), (13), (16), (18), (20), (27), (29), (32) or (36).

(G) 1 Mol of cyanobenzaldehyde is reacted with 1 mol of acetophenone and sodium hydroxide in ethanol. The resulting 3-(p-cyanophenyl)-3-phenylpropanone is reacted with $KHSO_4$ to obtain p-cyanochalcone. The p-cyanochalcone is hydrogenated in the presence of a platinum catalyst to produce 3-(p-cyanophenyl)-1-phenylpropanone. The resulting compound is reacted with hydrazine and potassium hydroxide in triethylene glycol to produce p-cyanodiphenylpropane. The p-cyanodiphenylpropane is reacted with fuming nitric acid and acetic acid anhydride to produce 1-(p-cyanophenyl)-3-(p-nitrophenyl)-propane.

This process is applicable to compounds having a cyano group and a nitro group in the molecule such as (3), (9), (14), (17), (21), (26), (33) or (34).

(H) 1-(p-Cyanophenyl)-3-(p-nitrophenyl)-propane produced in method (C) is hydrogenated in the presence of 10% paradium-carbon catalyst to produce 1-(p-aminophenyl)-3-p-cyanophenyl)-propane.

This process is applicable to compounds having an amino group and a cyano group in the molecule such as (4).

(I) p-Nitrobenzaldehyde is reacted with acetophenone and sodium hydroxide in ethanol to produce 3-(p-nitrophenyl)-3-hydroxy-1-phenyl propanone. The resulting compound is reacted with $KHSO_4$ to obtain p-nitrochalcone. p-Nitrochalcone is hydrogenated in the presence of platinum catalyst to produce 3-(p-aminophenyl)-1-phenyl propanone. The resulting compound is reacted with potassium hydroxide and hydrazine in triethylene glycol to produce p-aminodiophenyl-propane. p-Aminodiphenylpropane is reacted with fuming nitric acid and acetic acid anhydride to obtain 1-(p-aminophenyl)-3-p-nitrophenyl)-propane.

This process is applicable to compounds having a nitro group and an amino group in the molecule such as (5) or (24).

(J) 1-Acetonaphtone is reacted with 1-naphtoaldehyde and sodium hydroxide in ethanol to produce 1,3-dinaphthyl-3-hydroxypropanone. The resulting compound is reacted with $KHSO_4$ to obtain 1,3-dinaphthyl-3-propene-1-on. The resulting compound is reacted with hydrazine and potassium hydroxide in triethylene glycol to produce 1,3-dinaphthylpropane. 1,3-Dinaphthylpropane is reacted with fuming nitric acid and acetic acid anhydride to produce 1,3-dinitronaphthyl-propane.

This process is applicable to naphthalene derivatives such as (20) or (21).

Methods for preparing the organic non-linear optical materials are not limited to the examples mentioned above, and the materials may be prepared by the other conventional methods.

Examples of the atomic groups having $\pi$-electron conjugated structures in simbols A and B of the general formula (I) are benzene ring, pentalene ring, indene ring, naphthalene ring, azulene ring, heptalene ring, biphenylene, indacene, acenaphthene, fluorene, phenalene, phenanthlene, anthracene, fluoranthene, acephenanthrylene, aceanthrylene, triphenylene, pyrene, perylene, pentaphene, pentacene, furan, thiophene, pyrrole, oxazole, isooxazole, thiazole, isothiazole, imidazole, pyrazole, furazan, pyran, pyron, pyridine, pyrididazine, pyrimidine, pyrazine, pyrroline, imidazoline, indole, benzimidazole, isoindole, indazole, chromene, coumalin, chromone, quinoline, isoquinoline, cinnoline, quinazoline, quinoxaline, phthalazine, purine, pteridine, xanthene, xanthone, carbazole, phenanthridine, acridine, phenazine and phenanthroline.

According to the present invenin, non-linear optical materials of crystalline structure with no inversion center are obtained by combining atomic groups containing $\pi$-electron conjugated system with $-(CH_2)_3-$ and $-CH=CH-C(=CH_2)-$. This is because $-(CH_2)-$ and $-CH=CH-C(=CH_2)-$ have no inversion center and the length of the connection is appropriate to induce effectively a second order optical effect in the crystalline structure. Further, the non-linear optical materials of the present invention make the cutoff wavelength shorter and are excellent in their non-linear optical characteristics and material stability, so the materials are particularly useful as the second order non-linear materials for optical devices.

DEFINITIONS (1) Single crystal

When a crystalline substance is observed along a certain crystal axis, crystal axes in any angle are aligned in the same direction. The crystalline substance may have local minute defects such as small discrepancies in crystalline latices.

(2) Cutoff wavelength

A pure sample is dissolved in ethanol to prepare a 0.1 m mol/l solution. An end portion at a long wavelength side, which ie regarded as a rising of absorption, in an absorption spectrum measured by means of a spectrometer is called a cutoff wavelength.

(3) Second harmonic generation intensity (SHG intensity)

The SHG intensity is set forth in S. K. Kurtz and T. T. Perry, J. Appl. Opt. 39, 3798, (1968). Powdered sample packed in a glass cell is irradiated with a YAG laser (wavelength is 1.064 μm) to generate green light having a wavelength of 532 nm. The intensity of the generated light is measured by means of a photomultiplier. The SHG intensity is expressed in the ration of the generated light intensity of the compounds used in the present invention to the intensity of second harmonic light by urea.

DETAILED DESCRIPTION OF PREFERRED EMBODIMENTS

SYNTHETIC EXAMPLE 1

132 G (0.1 mol) of glutaric acid was reacted with 216 g (2.0 mol) of o-phenylenediamine to produce 305 g of 1,3-bis-[1(3)H-benzimidazole-2-yl]-propane (yield was 98.3%) whose chemical formula is as follows:

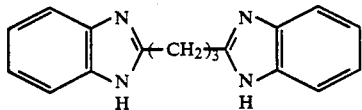

Thereafter, the resulting compound was nitrated by adding potassium nitrate and sulfuric acid to obtain 1,3-bis-[5-nitro-1(3)H-benzimidazole-2-yl-]-propane (compound No. 9, yield was 68%).

SYNTHETIC EXAMPLE 2

132 G (1.0 mol) of glutaric acid was reacted with 216 g (2.0 mol) of o-aminophenol to produce 225 g of 1,3-bis-(benzoxazole-2-yl)-propane (yield was 78%) whose chemical formula is as follows:

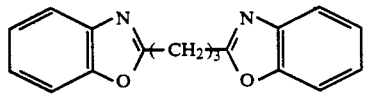

Thereafter, the compound was nitrated by adding potassium nitrate and sulfuric acid to obtain 147 g of 1,3-bis-(5-nitrobenzoxazole-2-yl)-propane (compound No. 12, yield was 72%).

SYNTHETIC EXAMPLE 3

132 G (1.0 mol) of glutaric acid was reacted with 211 g (2.0 mol) of o-mercaptoaniline to produce 270 g (yield was 78%) of 1,3-bis-(benzthiazole-2-yl)-propane whose chemical formula is as follows:

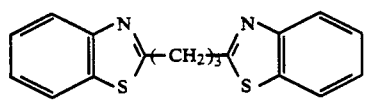

Thereafter, the compound was nitrated by adding potassium and sulfuric acid to obtain 1,3-bis-(5-nitrobenzthiazole-2-yl)-propane (compound No. 15).

SYNTHETIC EXAMPLE 4

136 G (1.0 mol) of p-anisaldehyde was reacted with 165 g (2.0 mol) of p-nitroacetophenone in the presence of sodium hydroxide dissolved in 500 ml of hexane. After aldol condensation, carbonyl group of the resulting compound was converted to olefin by using Wittig regent to obtain compound No. 28.

FIG. 1 shows a schematic diagram of a wavelength conversion device using secong harmonic generation. Laser beam 2 of frequency ω from a semiconductor laser 1 is impinged on the one face of a single crystal of the organic non-linear optical material mentioned above through lenses 3. The laser beam is oscilated in the crystal 4 and second harmonic light 6 is generated. The light 6 is emitted through lens 7 and filter 5 to cut fundamental wave thereby to obtain pure second harmonic light of frequency 2ω.

The single crystal 4 was formed on a substrate 8 of a glass by liquid epitaxial growth from a solution of an non-linear optical material. As a material for the substrate, glass, quraz, crystal of lithium niobate or the like is used. The substrate should be non-transparent to the laser beam and second harmonic wave or should have a smaller refractive index than the single crystal. The thickness of the single crystal formed on the substrate is about 100 μm to 2 mm. In the present invention, a single crystal made by crystalization of a melt or a solution of the compound may also be used. Such bulk single crystal has a flat impinging face (highly smooth face) perpendicular to a crystal axis by which the maximum second harmonic wave is generated. The bulk single crystal has also an emitting face which is parallel to the impinging face. The impinging face is the plane where laser beam impinges, and the emitting face is the plane where second harmonic wave is emitted.

EXAMPLE 1

A wavelength conversion device shown in FIG. 1 was prepared in the same manner as mentioned above.

The single crystal was formed from a solution of 1,3-bis-(1(3)H-5-nitrobenzimidazole-2-yl)-propane (compound No. 9) dissolved in ethanol. The compound was prepared by synthetic example 1. The generated light 6 was a blue second harmonic light. A second harmonic generation in a possible phase matching direction was observed using a laser diode (product of Hamamatsu Photonics, L2376) having peak wavelength of 890 nm and peak power of 10 W.

EXAMPLE 2

A wavelength conversion device shown in FIG. 1 was prepared in the same manner as mentioned above. A compound used in this example was 1,3-bis-(2-nitrobenzoxazole-2-yl)-propane (compound No. 12) prepared in synthetic example 2. The resulting second harmonic light was blue.

EXAMPLE 3

A wavelength conversion device shown in FIG. 1 was prepared in the same manner as mentioned above. A compound used in this example was 1,3-bis-(5-nitrobenzthiazole-2-yl)-propane (compound No. 12) prepared in synthetic example 2. The resulting second harmonic light was blue.

EXAMPLE 4

A wavelength conversion device shown in FIG. 1 was prepared in the same manner as mentioned above. A compound used in this example was compound No. 28) prepared in synthetic example 4. The resulting second harmonic light was blue.

EXAMPLE 5

The second harmonic properties of the compounds used in the present invention were measured with a powder method. Sample powder had a grain size of 100 to 200 μm. Samples packed in a glass tube were irradiated with a YAG laser for generating beam having a wavelength of 1.064 μm, a peak power of 1 kW and a pulse width of 100 ps. The intensity of the second harmonic light of 0.532 μm was measured with a photomultiplier. Relative intensities of the second harmonic light of the compounds with respect to that of urea and cutoff wavelengths are shown in Table 1.

TABLE 1

| Compound No. | Intensity of second harmonic generation | Cutoff wavelength (nm) |
| --- | --- | --- |
| 7 | 7.2 | 385 |
| 8 | 6.0 | 380 |
| 10 | 6.0 | 385 |
| 1 | 5.0 | 400 |
| 24 | 6.0 | 390 |
| 22 | 5.8 | 385 |

The present invention is applicable to various non-linear optical devices such as a Cerenkov's wave guide type device where original laser beam having a frequency of ω is impinged through a lens upon the end face of a single crystal of the organic non-linear optical compound. The single crystal generates second harmonic wave having a frequency of 2ω in an inclined direction with respect to the axis of the original light wave and the original wave passing through the single crystal is cut off by means of a filter.

Another application is a Cerenkov's fiber type device in which a semiconductor laser emits original wave of ω. The laser beam passes through an optical system comprising a lens, anamorphic prism pair and a lens to impinge the end face of a core of the single crystal which is surrounded by an optical clad. The fiber core emits through a filter a second harmonic wave having a frequency of 2ω.

The third application is a cavity or an inner resonance type device in which a semiconductor laser emits a laser beam towards an optical system comprising a lens, a semi-transparent mirror or a half mirror, a ¼ wave length plate, an Nd:YAG rod and a half mirror. The non-linear optical device is placed in a cavity constituted by the mirrors, ¼ wave-length plate and Nd:YAG rod. The original wave having a frequency of ω enters through the first half mirror into the cavity and impinges on the end face of the single crystal of the non-linear organic compound. The second harmonic wave of a frequency of 2ω emitted from the single crystal is refrected by the second half mirror and goes back towards the first half mirror. The thus generated second harmonic wave travels back and forth in the cavity until the wave of a desired intensity is produced. Thus a strong second harmonic wave is emitted through the second half mirror. In this case, the half mirrors function as a filter.

What is claimed is:

1. A non-linear optical device comprising a semiconductor for generating an original light wave, a single crystal of a non-linear optical material for generating second harmonic wave, a lens for focussing the original light towards the single crystal, and means for filtering the original light passing through the device, in which the non-linear optical material is an organic compound represented by the following general formula, $$A-(Cx)-B \qquad (I)$$

where (Cx) is $-(CH_2)_3-$ or $-CH=CH-C(=CH_2)-$, A and B are each atomic group comprising a π-electron conjugated structure containing at least one electron withdrawing group or one electron donating group, A and B being the same or different.

2. The non-linear optical device according to claim 1, where the second harmonic wave generated by the single crystal has an intensity of at least 4 with respect to the intensity of urea and a cutoff wavelength is 420 nm or less.

3. The non-linear optical device according to claim 1, where the organic non-linear optical material is represented by the formula,

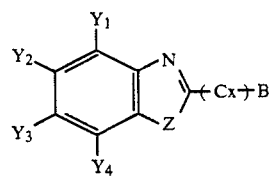

(II)

wherein $Y_1 \sim Y_4$ are each H, an electron withdrawing group or an electron donating group, B is the same as set forth above, ans z is $-O-$, $-NH-$, $-S-$ or $-CO-$, $Y_1 \sim Y_4$ being the same or different.

4. The non-linear optical device according to claim 1, where the non-linear optical material is an organic compound represented by the following general formula,

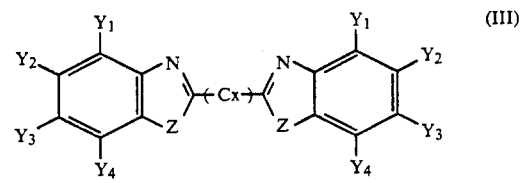

(III)

wherein $Y_1 \sim Y_4$ are each H, electron withdrawing group or electron donating group and z is $-O-$, $-NH-$, $-S-$ or $-CO-$, $Y_1 \sim Y_4$ being the same or different.

5. The non-linear optical device according to claim 1, wherein the single crystal is carried on a substrate in the form of a thin layer.

6. The non-linear optical device according to claim 1, wherein the single crystal is a bulk having a flat impinging face and a flat emitting face rectangular to a crystal axis by which the maximum second harmonic wave is generated.

7. A non-linear optical element comprising a single crystal layer of an organic non-linear optical material and a substrate carrying the layer, in which the non-linear optical material is an organic compound represented by the following general formula, $$A-(Cx)-B \qquad (I)$$

where (Cx) is —(CH$_2$)$_3$— or —CH=CH—C(=CH$_2$)—, A and B are each atomic group comprising a π-electron conjugated structure containing at least one electron withdrawing group or one electron donating group, A and B being the same or different.

8. The non-linear optical device according to claim 7, where the second harmonic wave generated by the single crystal has an intensity of at least 4 with respect to the intensity of urea and a cutoff wavelength is 420 nm or less.

9. The non-linear optical device according to claim 7, where the organic non-linear optical material is represented by the formula,

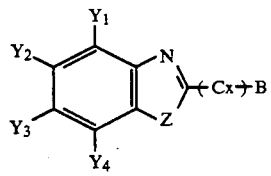
(II)

wherein Y$_1$~Y$_4$ are each H, an electron withdrawing group or an electron donating group, B is the same as set forth above, ans z is —O—, —NH—, —S— or —CO—.

10. The non-linear optical device according to claim 7, where the non-linear optical material is an organic compound represented by the following general formula,

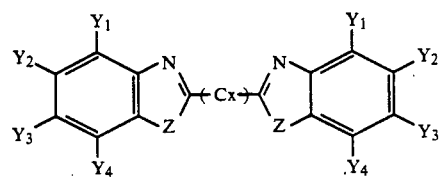
(III)

wherein Y$_1$~Y$_4$ are each H, electron withdrawing group or electron donating group and z is —O—, —NH—, —S— or —CO—, Y$_1$~Y$_4$ being the same or different.

11. The non-linear optical device according to claim 7, wherein the single crystal is carried on a substrate in the form of a thin layer.

12. A non-linear optical element comprising a single crystal layer of an organic non-linear optical material having a flat impinging face and a flat emitting face rectangular to a crystal axis by which the maximum second harmonic wave is generated, in which the non-linear optical material is an organic compound represented by the following general formula, A—(Cx)—B     (I)

where (Cx) is —(CH$_2$)$_3$— or —CH=CH—C(=CH$_2$)—, A and B are each atomic group comprising a π-electron conjugated structure containing at least one electron withdrawing group or one electron donating group, A and B being the same or different.

13. The non-linear optical device according to claim 12, where the second harmonic wave generated by the single crystal has an intensity of at least 4 with respect to the intensity of urea and a cutoff wavelength is 420 nm or less.

14. The non-linear optical device according to claim 12, where the organic non-linear optical material is represented by the formula,

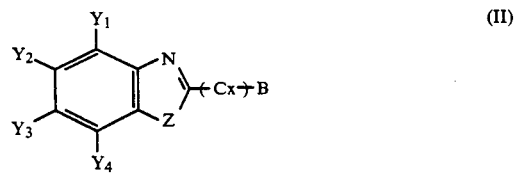
(II)

wherein Y$_1$~Y$_4$ are each H, an electron withdrawing group or an electron donating group, B is the same as set forth above, ans z is —O—, —NH—, —S— or —CO—, Y$_1$~Y$_4$ being the same or different.

15. The non-linear optical device according to claim 12, where the non-linear optical material is an organic compound represented by the following general formula,

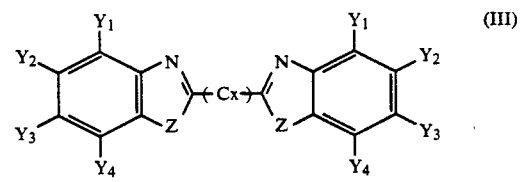
(III)

wherein Y$_1$~Y$_4$ are each H, electron withdrawing group or electron donating group and z is —O—, —NH—, —S— or —CO—, Y$_1$~Y$_4$ being the same or different.

* * * * *